US007183495B2

(12) United States Patent
Yoshida et al.

(10) Patent No.: US 7,183,495 B2
(45) Date of Patent: Feb. 27, 2007

(54) ELECTRICAL CONNECTOR

(75) Inventors: Satoshi Yoshida, Tokyo (JP); Takashi Nagawatari, Tokyo (JP)

(73) Assignee: Hirose Electric Co., Ltd., Tokyo (JP)

( * ) Notice: Subject to any disclaimer, the term of this patent is extended or adjusted under 35 U.S.C. 154(b) by 0 days.

(21) Appl. No.: 11/064,232

(22) Filed: Feb. 24, 2005

(65) Prior Publication Data

US 2005/0202711 A1 Sep. 15, 2005

(30) Foreign Application Priority Data

Mar. 29, 2004 (JP) ............................. 2004-094184
Dec. 3, 2004 (JP) ............................. 2004-350612

(51) Int. Cl.
*H05K 1/02* (2006.01)

(52) U.S. Cl. ...................................................... 174/259

(58) Field of Classification Search ................ 174/259, 174/258, 261; 439/495
See application file for complete search history.

(56) References Cited

U.S. PATENT DOCUMENTS 4,626,298 A * 12/1986 Allard ......................... 156/55
6,208,525 B1 * 3/2001 Imasu et al. ................ 361/783
6,489,573 B2 * 12/2002 Wu et al. .................... 174/259
6,791,036 B1 * 9/2004 Chen et al. ................. 174/257

FOREIGN PATENT DOCUMENTS

JP 2003-176473 6/2003
JP 2004-63373 2/2004

* cited by examiner

*Primary Examiner*—Tuan Dinh
*Assistant Examiner*—Ivan Carpio
(74) *Attorney, Agent, or Firm*—Takeuchi & Kubotera, LLP

(57) ABSTRACT

A cable connection structure includes an insulation holding body (3); a connection section (2) supported by the insulation holding body (3); a core wire (6) provided at a position corresponding to that of the connection section (2); a bonding agent (4) provided on at least the insulation holding body (3); and an insulation member (5) provided on the core wire (6) and the bonding agent (4) to press the bonding agent (4) between the insulation member (5) and the insulation holding body (3), thereby bonding the insulation member (5) to the insulation holding body (3).

12 Claims, 15 Drawing Sheets

ELECTRICAL CONNECTOR

BACKGROUND OF THE INVENTION

1. Field of the Invention

The present invention relates to a wire connection structure and an electrical connector with a cable.

2. Description of the Related Art

Recently, a bonding agent or anisotropic conductive material is widely used to connect cables for electronics equipment. An example of the anisotropic conductive material is an anisotropic conductive film. As JP 2003-176473 shows, the anisotropic conductive film is made by dispersing conductive particles and hardening and other additional agents in an epoxy resin. In use, the anisotropic conductive film is provided between two cables and heated and pressed in a high temperature atmosphere. The conductive particles are brought into close contact with each other in the film area under the pressure so that the portions of the cables are electrically connected through the conductive particles in the film area. Another example of the anisotropic conductive material is an anisotropic conductive paste.

The non-conductive bonding materials include a non-conductive film and paste. The non-conductive bonding material is locally eliminated by the pressure between two cables so that the two cables are connected directly.

For example, the anisotropic conductive film is provided on a terminal and the core wire of a cable is provided on the film, and the core wire is pressed against the terminal in a high temperature atmosphere for connection. In this method, however, the core wire is held only by the contact surface of the anisotropic conductive film so that the core wire tends to fall. In addition, part of the conductive particles escape to opposite sides of the core wire under the pressure so that the number of closely contact conductive particles becomes so low that the electrical property becomes unstable. Moreover, the core wire is exposed, coming in accidental contact with other objects.

An electrical connector with cables includes a housing for plugging with a mating connector and a plurality of terminals arranged in the housing. The connection section of a terminal is soldered to the core wire of a cable and, upon plugging, the contact section is brought into contact with the terminal of a mating connector. Alternatively, the connection section of a terminal is provided on the connection pad of a circuit board for connection to a mating connector.

JP 2004-63373 discloses a connector using a circuit board to which very thin coaxial cables are connected. In general, the core wire of a coaxial cable is soldered to the connection pad of a circuit board. Recently, there is a demand for thin coaxial cables and a small pitch with which the coaxial cables are arranged for small size, light weight electronic devices. When the thin coaxial cables are soldered with a pitch of no more than 0.4 mm, the adjacent terminals tend to be bridged with the solder, causing short circuit.

In order to solve such a problem, a jig is provided on the central conductors of thin coaxial cables on the connection pads and a laser is irradiated through the jig to connect the central conductors to the pads and, then, the laser is irradiated again to cut the pads between the central conductors.

The above method, however, requires not only the special jig through which a laser is irradiated but also the two doses of laser irradiation for melting solder and cutting the pad. If the diameter of central conductors or the number of cables is changed, another jig is required.

SUMMARY OF THE INVENTION

Accordingly, it is an object of the invention to provide a cable connection structure capable of providing not only a higher retention force of the core wire but also a higher insulating property in the connection area.

It is another object of the invention to provide an electrical connector with cable capable of readily connecting thin cables with a small pitch.

According to an aspect of the invention there is provided a cable connection structure in which a core wire is connected to a connection section with a bonding agent. The cable connection structure includes an insulation holding body; a connection section supported by the insulation holding body; a core wire provided at a position corresponding to that of the connection section; a bonding agent provided on at least the insulation holding body; and an insulation member provided on the core wire and the bonding agent to press the bonding agent between the insulation member and the insulation holding body, thereby bonding the insulation member to the insulation holding body.

Since the insulation member bonded to the insulation holding body presses the core wire against the connection section for contact, the core wire is held on the connection section with a very strong force. The insulation member covers the core wire so that accidental short circuit can be prevented.

The connection section may be project from the insulation holding body or indented from the insulation holding body to increase the retention force of the insulation member or stabilize the position of the core wire. The connection section may have a concave surface for contact with the bonding agent to further stabilize the position of the core wire on the connection section.

The connection section may be a terminal and the insulation holding body may be a housing. The connection section may be a land provided on a circuit board and the insulation holding body may be a body of the circuit board.

The insulation member may be an insulation film or an insulation case. The core wire may be flattened before connection to increase the contact area between core wires or the core wire and the connection section and the positional stability of the core wire. The bonding agent may be made of an anisotropic conductive material. It may be in the form of a film or paste. The bonding agent may be non-conductive.

A method of making the cable connection structure includes the steps of holding the connection section on the insulation holding body; providing the bonding agent at least on the insulation holding body; providing the core wire at the position corresponding to the connection section; providing the insulation member over the core wire and the bonding agent; and applying a pressure on the insulation member while heating the bonding agent to bond the insulation member with the insulation holding body, thereby connecting the core wire to the connection section.

Where the insulation member is flexible, an elastic matt is used to press the insulation member which in turn presses the core wire. Even if the insulation member is deformed by the core wire, the matt undergoes elastic deformation so that the entire surface of the insulation member is pressed.

According to the one aspect of the invention, when the core wire of a cable is connected to the connection section with the bonding agent, the insulation member is provided so that the core wire and the bonding agent are pressed between the insulation member and the connection section, thereby increasing the retention force of the core wire by the bonding agent. Since the insulation member presses both sides of each core wire, the conductive particles will not escape to the sides to thereby stabilize the electrical connection.

According to another aspect of the invention there is provided a connector equipped with cables including a circuit board; a plurality of connection pads provided on the circuit board at predetermined intervals; a plurality of cables with core wires connected to the connection pads; a plurality of contact pads connected to the connection pads and brought into contact with terminals of a mating connector; and a conductive material for bonding the core wires with the connection pads.

The connection with the conductive material eliminates short circuit by the solder bridge and is suitable for the arrangement of cables with a small pitch. The connection is done by merely pinching in a high temperature atmosphere.

Every other the connection pads are connected to circuit trances provided on another face of the circuit board so that contact pads can be arranged with a pitch twice the pitch of the connection pads. Consequently, the terminals of a mating connector can be arranged twice the pitch of the connection pads, thus simplifying the manufacture. A pair of adjacent ones of the connection pads provided in an arranging direction may be connected to a pair of contact pads provided on another face of the circuit board on a line perpendicular to the arranging direction.

A ground member to which shields of the cables are connected may be provided. A window extending in the arranging direction beyond an arranging range of the cables may be provided so that a comb-shaped jig is insertable through the window. A reinforcing member may be attached to a surface of the circuit board on another surface of which the connection pads are provided. The reinforcing member may have another window corresponding to the window of the circuit board.

A connector equipped with cables, according to the invention, includes a housing; a plurality of terminals provided in the housing at predetermined intervals and having connection sections at one ends and contact sections at the other ends for contact with terminals of a mating connector; a plurality of cables with core wires connected to the connection sections of the terminals; and a conductive material for bonding the core wires to the connection sections of the terminals.

The terminals may be arranged alternately along opposite faces of the connector so that the connection sections are arranged alternately with a pitch that the cables are arranged. The conductive material may be an anisotropic conductive material.

As has been described above, the core wires are connected with the conductive material so that the connection operation is simplified. The core wires are connected to the connection pads via the conductive material so that the adjacent core wires are prevented from contacting.

DESCRIPTION OF THE PREFERRED EMBODIMENTS

Embodiments of the invention will now be described with reference to the accompanying drawings.

Figure 1A:
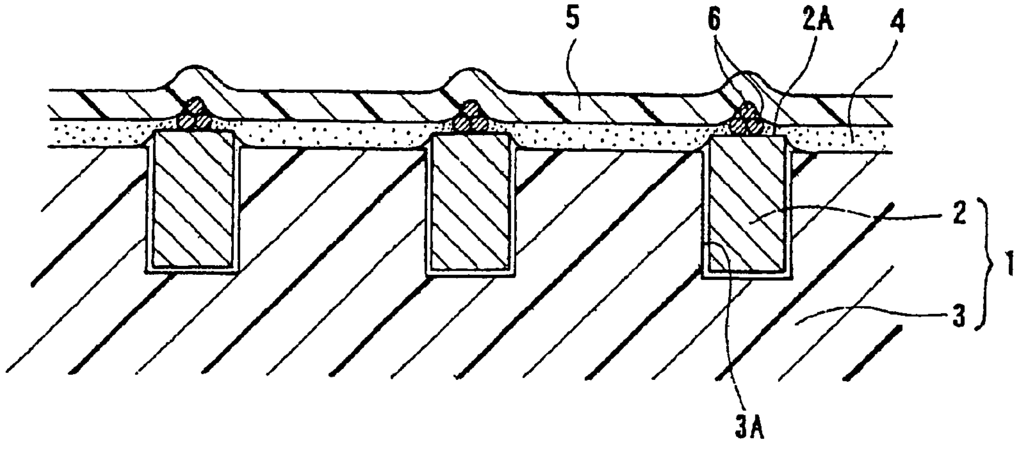
FIG. 1(A) is a sectional view of a cable connection structure according to the first embodiment of the invention.

In FIG. 1(A), an electrical connector 1 includes the connection sections 2 of a plurality of terminals and an insulating housing 3 for supporting the connection section 2. A plurality of retaining grooves 3A are provided in the insulating housing 3 at predetermined intervals. The connection sections 2 are provided in the retaining grooves 3A such that the top connection surfaces 2A slightly project from the top surface of the insulating housing 3.

The core wires 6 of a cable are pressed against the connection surface 2A by an insulating material or flexible sheet 5 that is bonded to the top surface of the insulating housing 3 with a bonding agent 4. The bonding agent may be any of those described above but the anisotropic conductive film or paste is preferred. The bonding agent 4 may be provided on the top surface of the insulating housing 3 except for the top connection surfaces 2A of terminals. The core wires 6 are connected to the connection section 2 directly or indirectly via the conductive particles of the bonding agent 4. The connection is held by the pressure of the insulating material 5 that is bonded to the insulating housing 3 by the bonding agent 4.

Figure 1B:
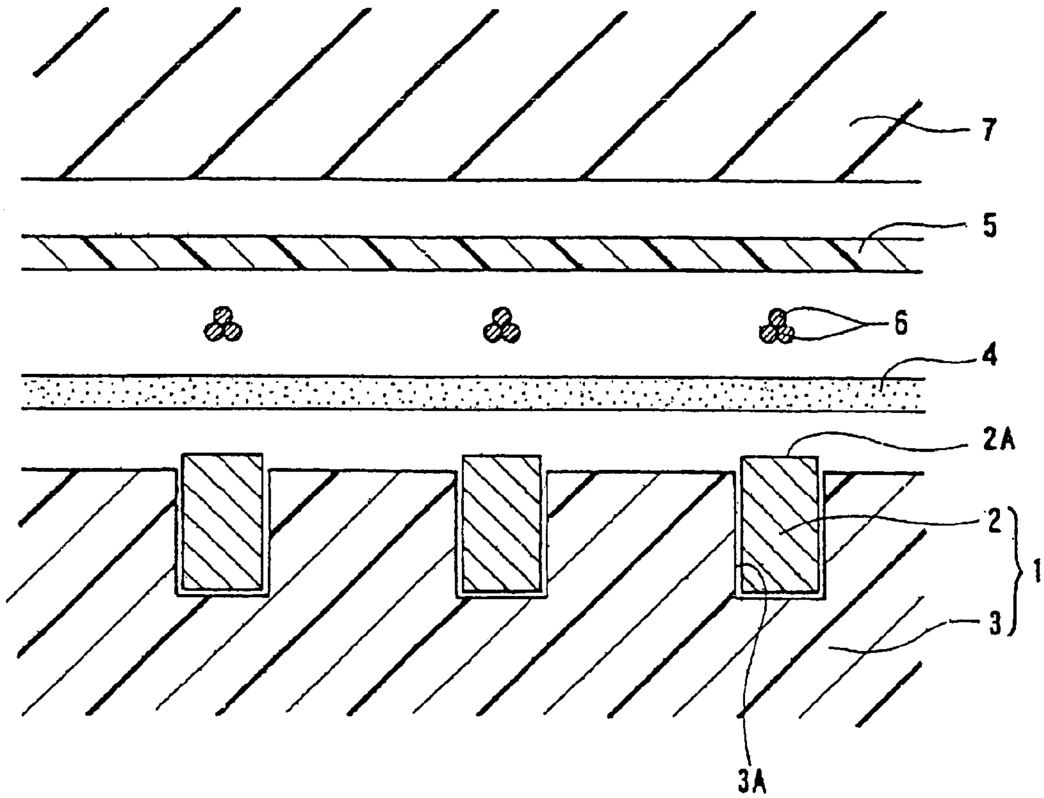
FIG. 1(B) is a sectional view of the cable connection structure before connection.

In FIG. 1(B), the bonding agent or anisotropic conductive film 4, the core wires 6 of a cable, and an insulating material sheet 5 are provided on the insulating housing 3 of the connector 1 and the connection sections 2 such that the core wires 6 are provided above the connection sections 2.

Then, by means of an elastic pressure member or matt 7, the insulating material 5 is pressed down in a high temperature atmosphere sufficiently hot to soften the bonding agent 4. The insulating material 5 is deformed and holds the core wires on the top surfaces of the connection sections 2. The core wires 6 is pressed to enter the soften film 4, thus coming into contact with the connection sections 2 directly or indirectly via the conductive particles. The soften film 4 is bonded with the insulation member 5 and the insulating housing 5 and hardened in the heating atmosphere to hold the connection as shown in FIG. 1(A). Finally, the matt 7 is removed.

The conductive film 4 is held by the insulating member 5 on both sides of the core wires 6 during the connection process so that the conductive particles do not escape to the sides but make contribution to the connection. After further heating in the atmosphere, both of the conductive film 4 and the insulation member 5 are hardened so that the close contact among the conductive particles and the retention of the core wires 6 by the insulation member 5 are fixed. The insulation member 5 insulates the core wires 6 from the outside. The connection sections 2 slightly project from the insulating housing 3 so that the insulation member 5 can press down the core wires 6 and the bonding agent 4 with more forces.

Figure 2:
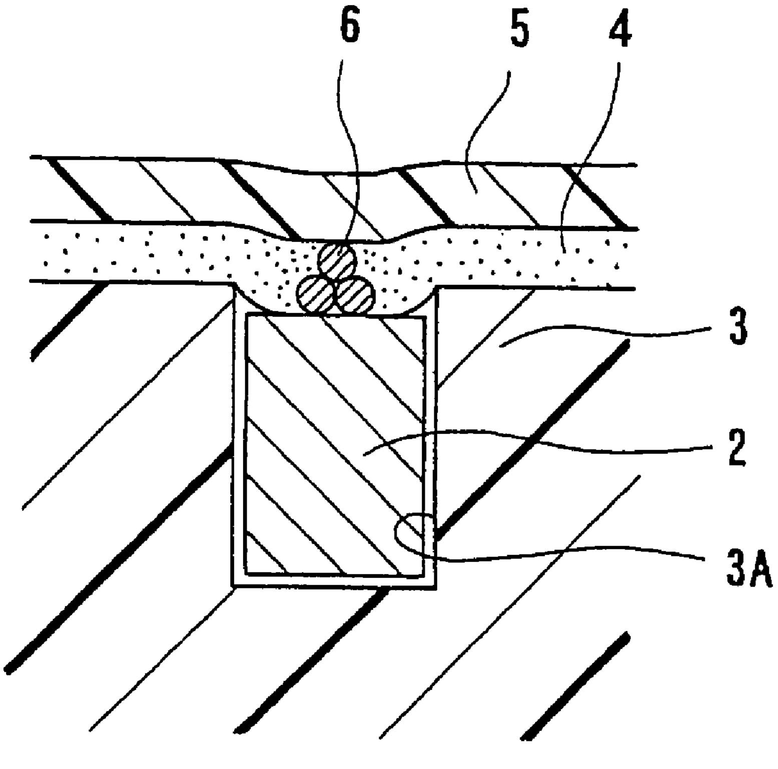
FIG. 2 is a sectional view of a cable connection structure according to the second embodiment of the invention.

In FIG. 2, the connection section 2 is slightly indented into the insulation housing 3 so that the retention groove 3A prevents the core wires 6 from falling from the connection section 2 and the conductive particles from escaping.

Figure 3:
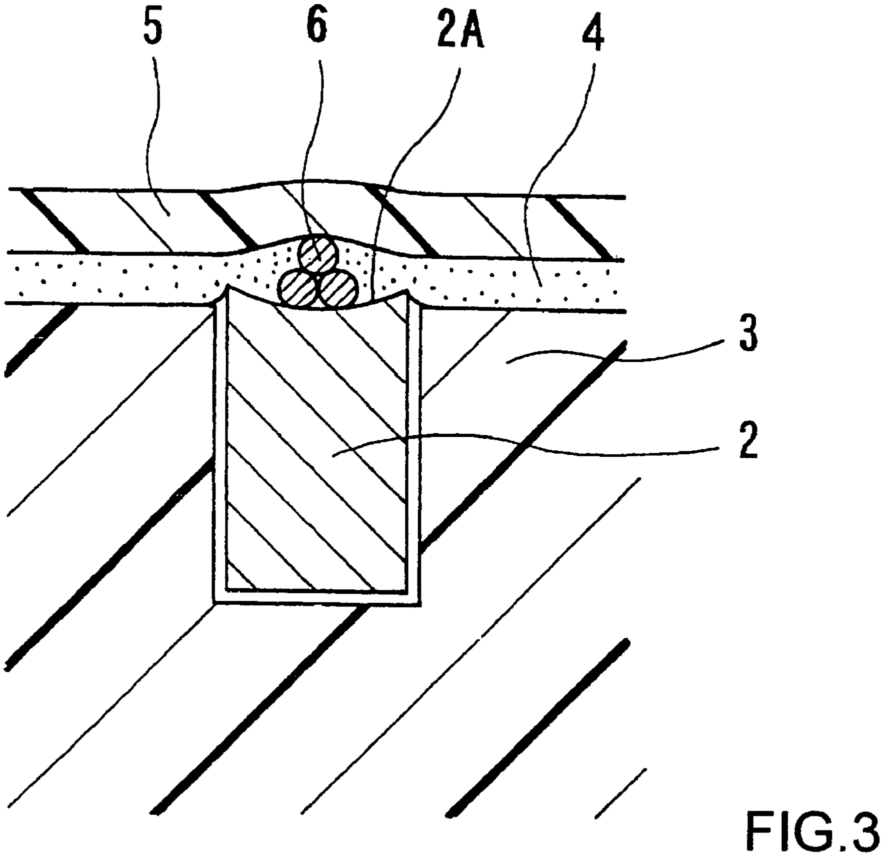
FIG. 3 is a sectional view of a cable connection structure according to the third embodiment of the invention.

In FIG. 3, the top surface 2A of the connection section 2 is made concave so that not only the position of the core wires 6 is made stable but also the escape of conductive particles is prevented.

Figure 4:
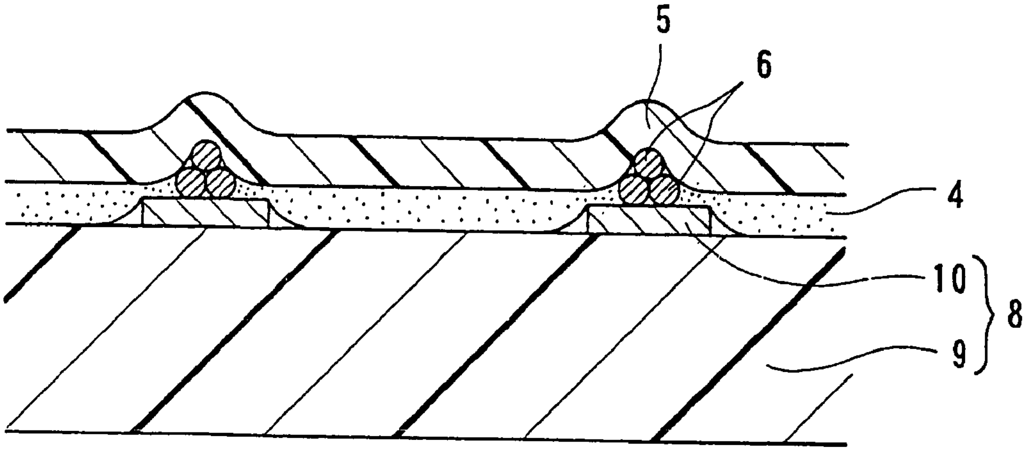
FIG. 4 is a sectional view of a cable connection structure according to the fourth embodiment of the invention.

In FIG. 4, a circuit board 8 includes a board member 9 made of an insulation material and a plurality of connection lands 10 provided on the board member 9. The conductive film 4, the core wires 6, and the insulation member 5 are provided on the connection lands 10 in the same manner as shown in FIG. 1.

Figure 5A:
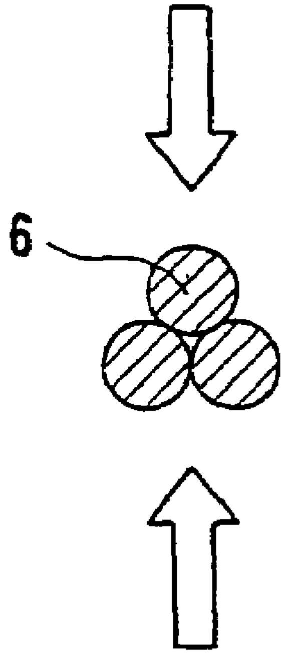
FIGS. 5(A) and (B) are sectional views of core wires before and after flattening, respectively, according to the fifth embodiment of the invention.
Figure 5B:
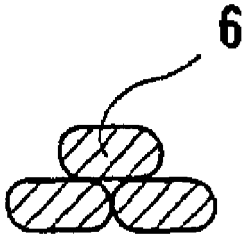

In FIGS. 5(A) and (B), the core wires 6 are pressed from above and below prior to the connection process to be flattened as shown in FIG. 5(B). These flattened wires 6 assure not only large contact areas between the core wires 6, and the core wires 6 and the conductive particles but also stable positions of the core wires 6.

Figure 6:
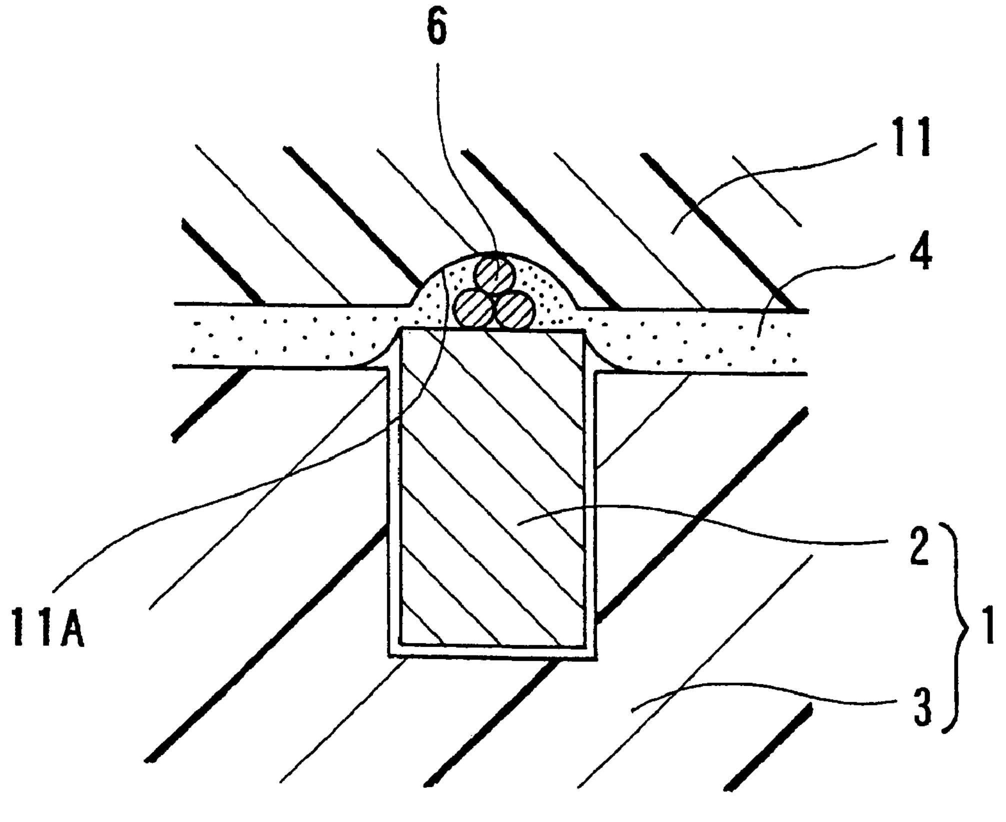
FIG. 6 is a sectional view of a cable connection structure according to the sixth embodiment of the invention.

In FIG. 6, the insulation member is replaced by an insulation case 11 having rigidity. It is preferred that a recess 11A is provided in the insulation case 11 to hold down the core wires 6 and assure a positional stability of the core wires and prevention of escape of conductive particles. The insulation case 11 can be used to press the core wires in the high temperature atmosphere so that the matt of FIG. 1 can be eliminated. The insulation case 11 may be either part of the connector or another member.

The seventh embodiment of the invention will be described with reference to FIGS. 7(A) and (B).

Figure 7A:
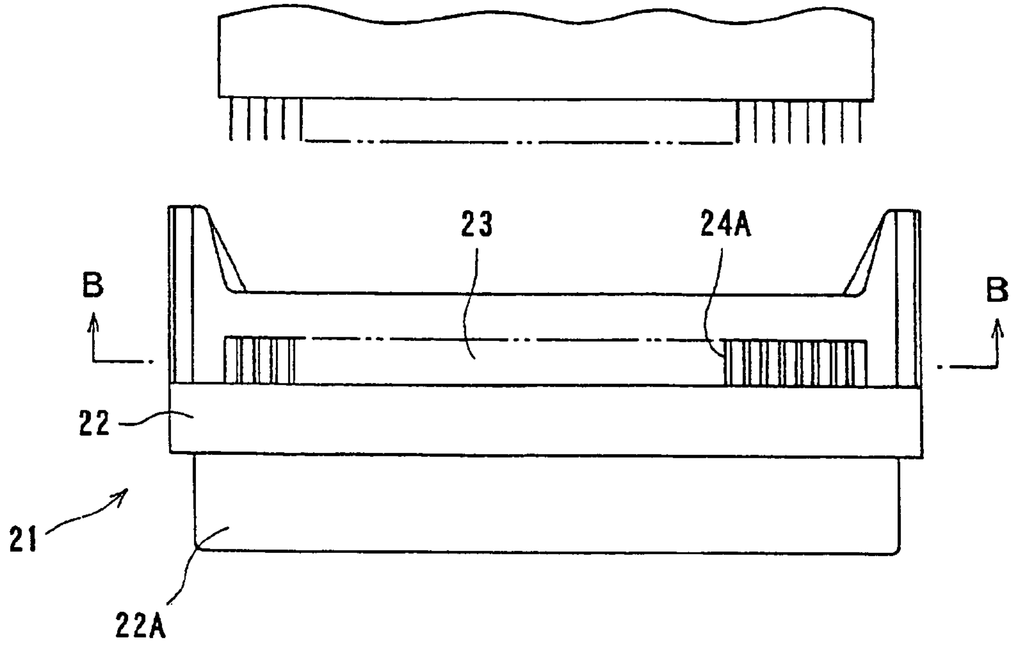
FIG. 7(A) is a top plan view of a connector and a cable according to the seventh embodiment of the invention.

In FIG. 7(A), a connector 21 includes an insulation housing 22 and a plurality of terminals 24A planted in the housing 22. It includes a plugging section 22A for receiving a mating connector and a terminal arranging surface 23.

Figure 7B:
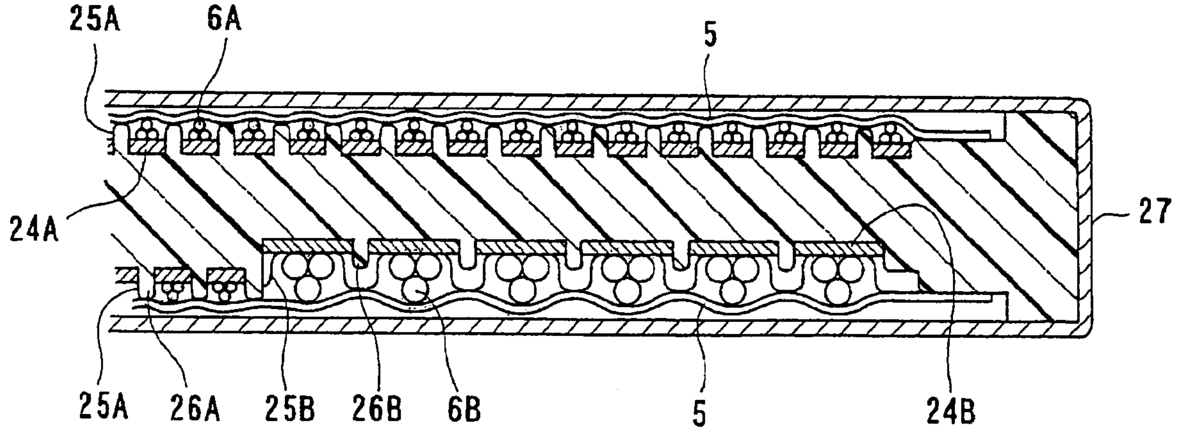
FIG. 7(B) is a sectional view taken along line B—B of FIG. 7(A)

In FIG. 7(B), on the terminal arranging surface 23 there are provided a plurality of ribs 26A and 26B to form grooves 25A and 25B in which the plate-shaped connection sections 24A and 24B of terminals are provided. The narrow grooves 25A are provided on the upper side to receive the narrow connection sections 24A of signal terminals while the narrow and broad grooves 25A and 25B are provided on the lower left and right sides to receive the narrow connection sections 24A and the broad connection sections 24B of power terminals. The core wires 6A and 6B of a flat cable C are pressed against the connection sections 24A and 24B of the terminals by the insulation film 5 for connection through the anisotropic conductive film. The insulation film 5 insulates the core wires 6A and 6B from a shield case 27.

Figure 8:
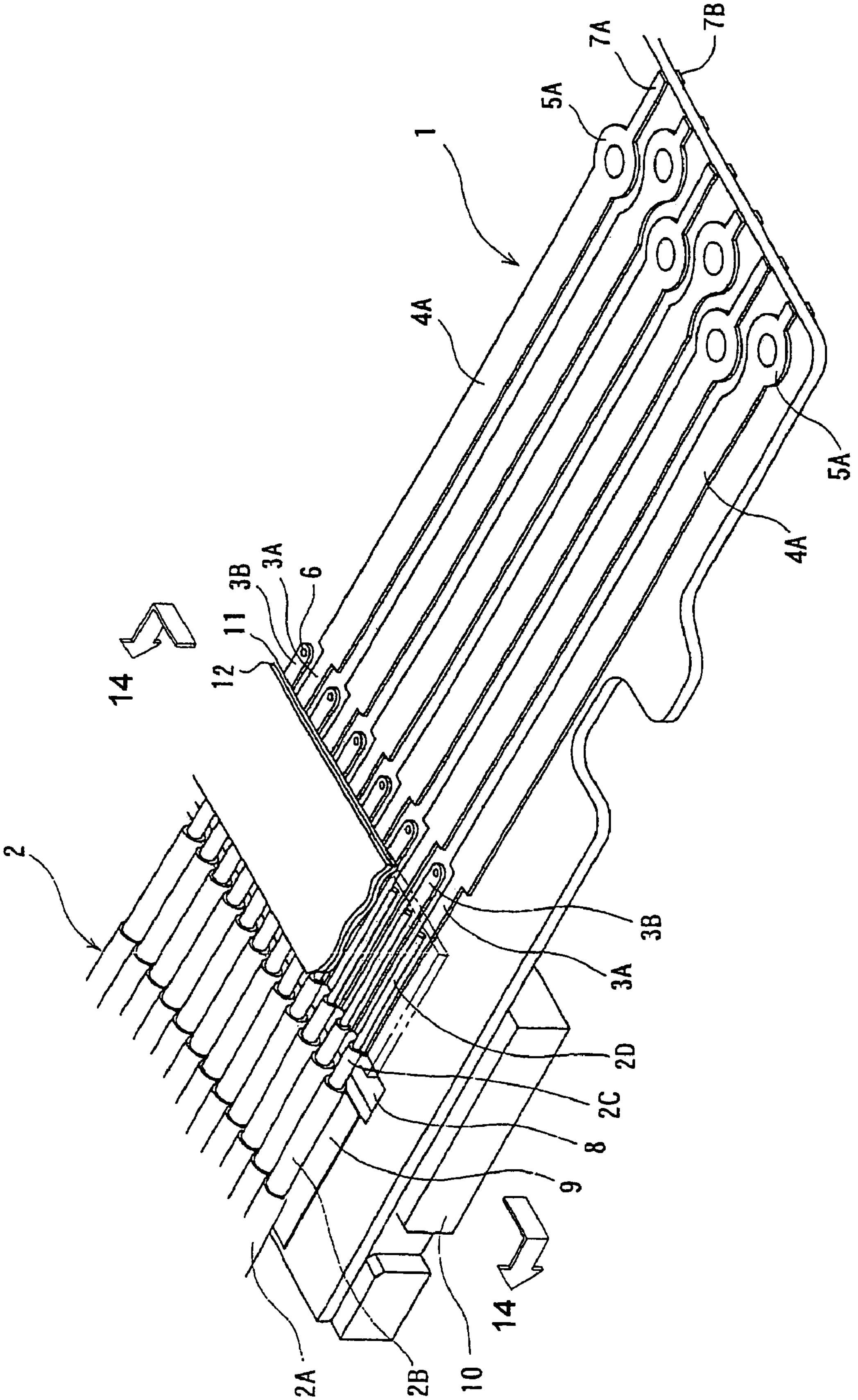
FIG. 8 is a perspective view of a connector equipped with cables according to the eighth embodiment of the invention.
Figure 9:
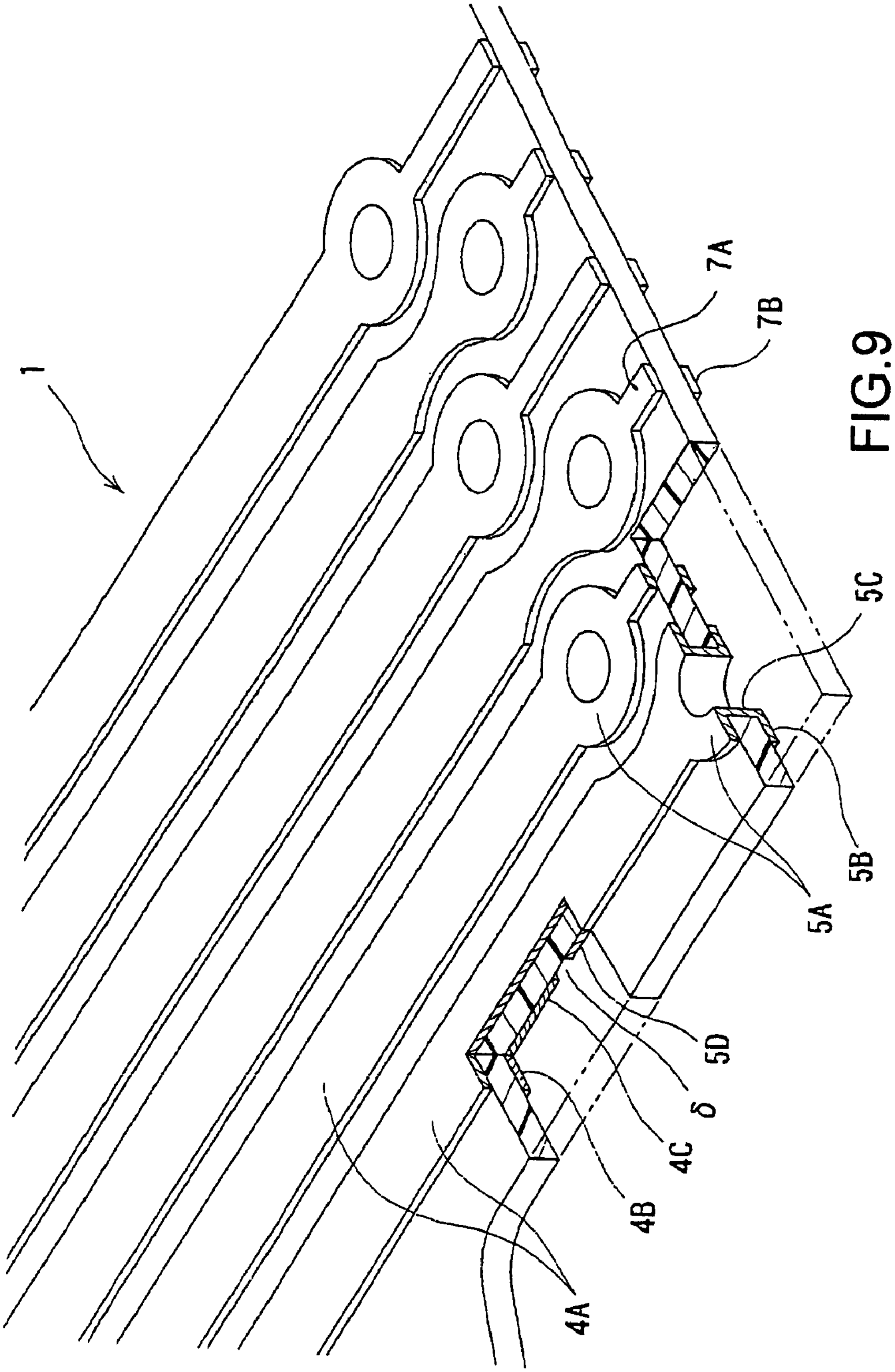
FIG. 9 is a perspective view, partially in section, of a circuit board of the connector of FIG. 8.

In FIG. 8, a plurality of coaxial cables 2 are connected to a circuit board 1. Two types of connection pads 3A and 3B are arranged alternately with the same pitch as the arranging pitch of the cables 2. A transmission path 4A extends from the connection pad 3A to an annular land 5A which is connected via a through hole 5C to an annular land 5B which is connected to a contact pad 5D on the back (FIG. 9). The connection pad 3B is connected to a transmission path 4B on the back via a through hole 6 that passes through the circuit board 1. The transmission path 4B extends along the transmission path 4A on the top face to a contact pad 4C which is spaced from the contact pad 5D by a distance δ (FIG. 9).

Since the adjacent connection pads 3A and 3B on the top face of the circuit board 1 are connected to the contact pads 5D and 4C on the bottom face via the transmission paths 4A and 4B, the contact pads can be disposed with the pitch twice the pitch of the connection pads. The annular pads 5A and 5B are connected to narrow paths 7A and 7B that extend to the edge of the circuit board 1. A window 8 is provided in the circuit board 1 adjacent to the connection pads 3A and 3B to extend in a direction perpendicular to the longitudinal direction of the cables 2 beyond the arrangement range of the cables 2. A conductive ground pad 9 extends along the window 8.

A reinforcing plate 10 of an insulative material is attached to the back of the circuit board 1 in the area covering the ground pad 9, the window 8, and the connection pads 3A and 3B. Another window is provided in the reinforcing plate 10 corresponding to the window 8 of the circuit board 1. The core wires of the cables 2 are connected to the connection pads 3A and 3B of the circuit board 1. The cables are a coaxial cable consisting of a jacket 2A, a shield 2B, a dielectric 2C, and a core wire or central conductor 2D. The central conductors 2D are connected to the connection pads 2A and 3B via an anisotropic conductive film 11. The conductive film 11 is covered by an insulation film 12. The shields 2B are connected to the ground pad 9 with solder or a conductive bond.

Such a connector as described above is used as follows.

Figure 10:
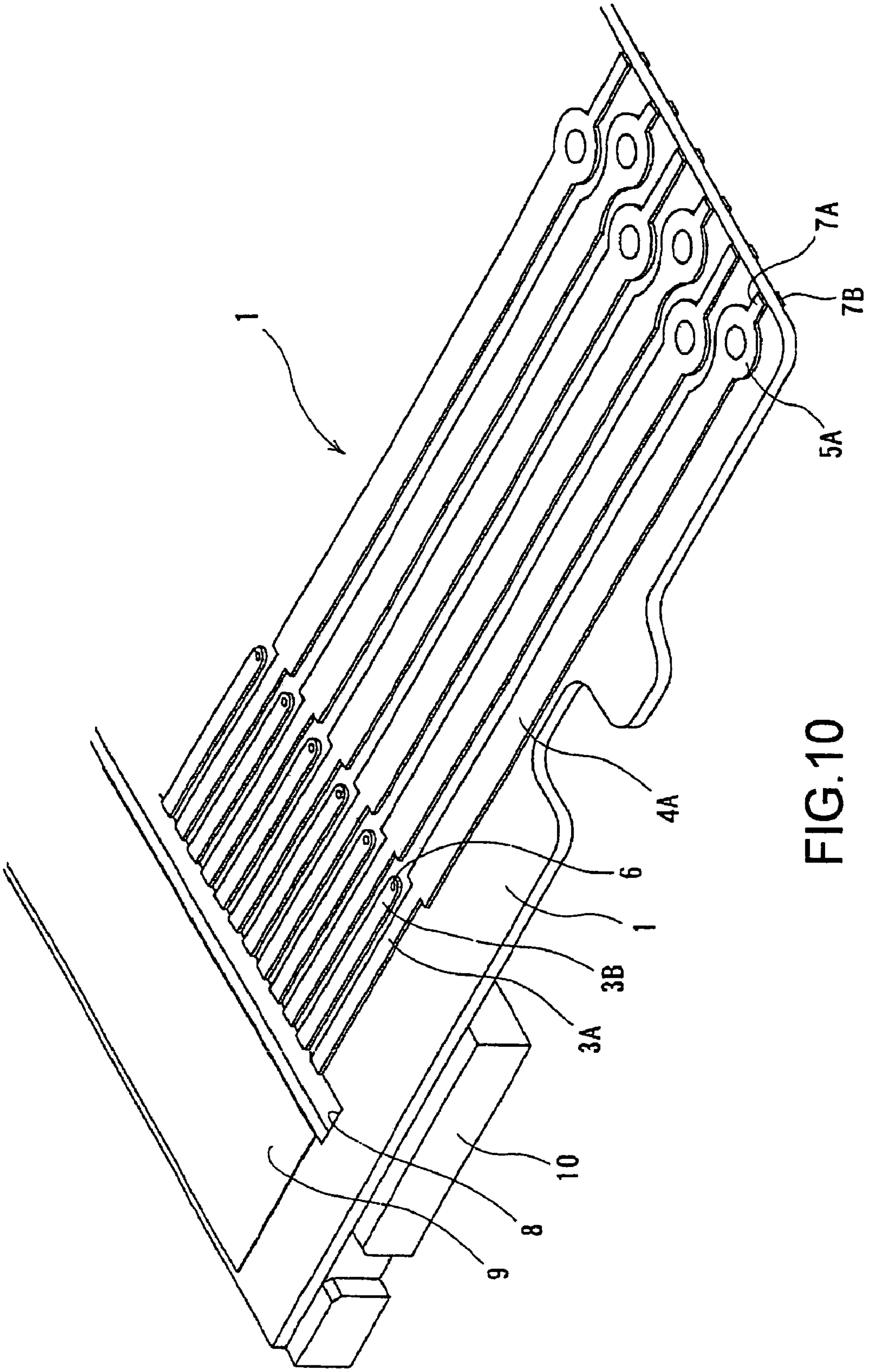
FIG. 10 is a perspective view of the circuit board before connection.
Figure 13A:
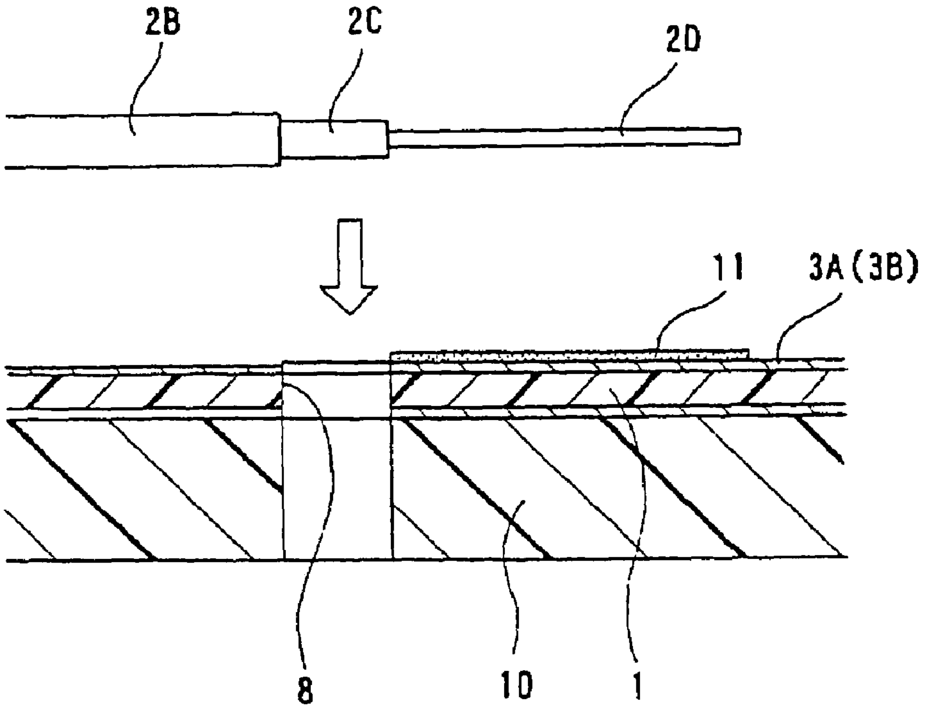
FIGS. 13(A) and (B) are sectional views of the connection section of the connector of FIG. 8 before and after connection, respectively.

(1) As shown in FIG. 10, the circuit board 1 with the reinforcing plate 10 is provided. The anisotropic conductive film 11 is disposed over the connection pads 3A and 3B. See FIG. 13(A).

Figure 11:
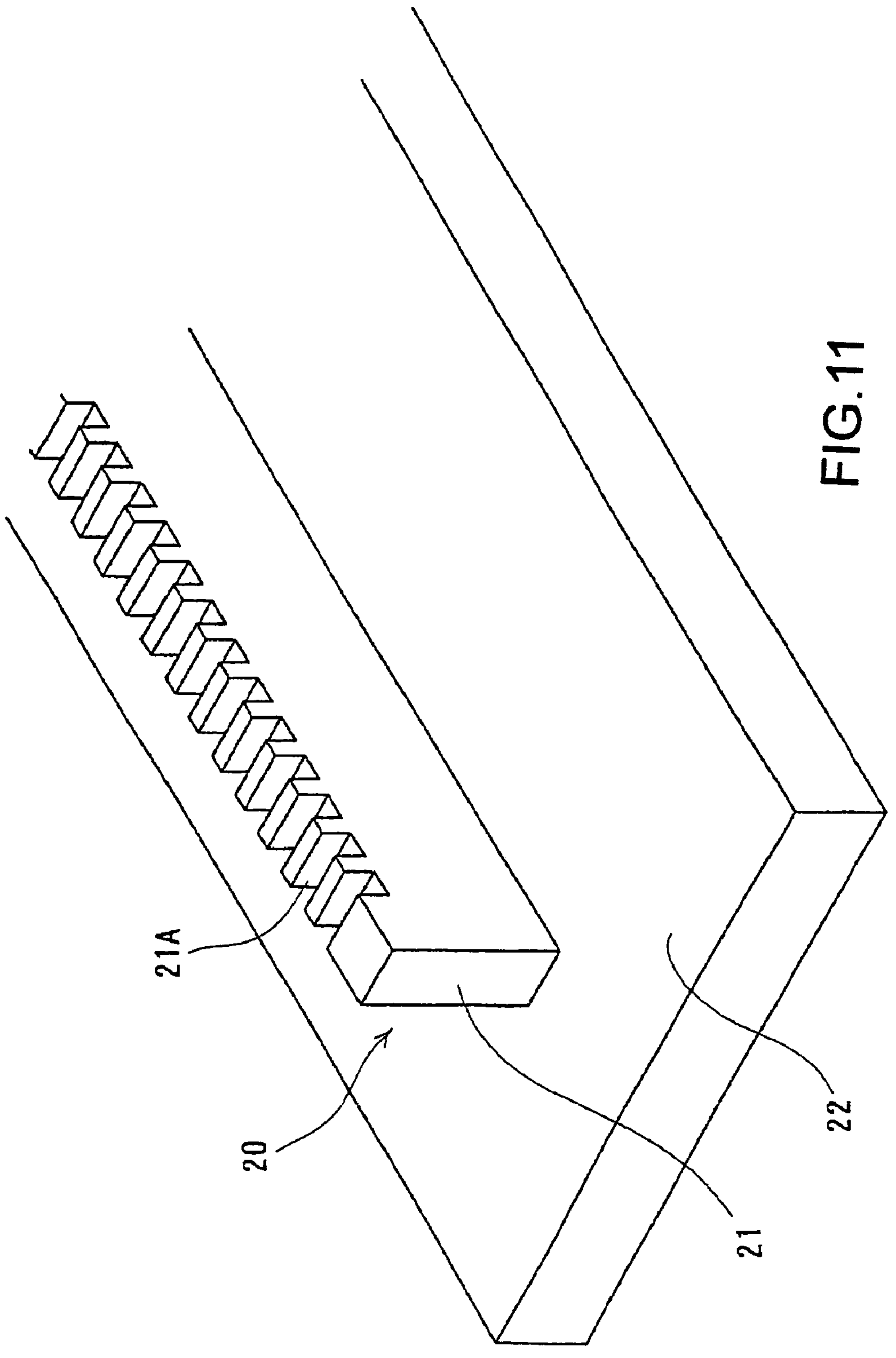
FIG. 11 is a perspective view of a jig for use in connection of the connector of FIG. 8.

(2) As shown in FIG. 11, a jig 20 is provided at the same time as above. The jig 20 consists of a comb-shaped arranging block 21 and a support plate 22 for supporting the arranging block 21. The arranging block 21 projects upward through the window of the reinforcing plate 10 and the window 8 of the circuit board 1. A plurality of grooves 21A are provided in the top face of the arranging block 21 with the pitch of the cables 2 to receive the dielectric members 2C of the cables 2.

Figure 12:
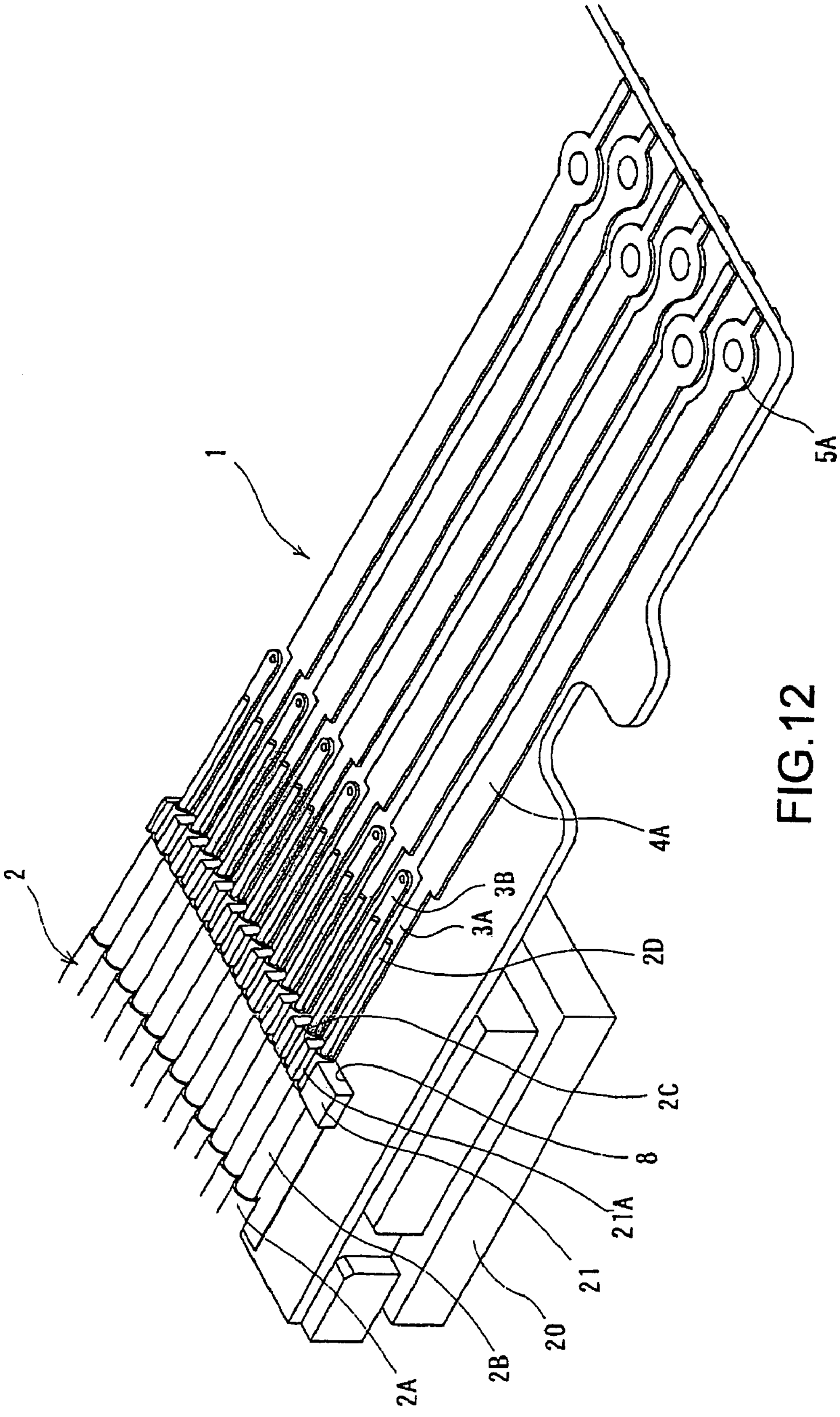
FIG. 12 is a perspective view of the connector of FIG. 8 under connection.

As shown in FIG. 12, the circuit board 1 with the reinforcing plate 10 is provided on the jig 20 and the dielectric members 2C of cables 2 are placed in the grooves 21A of the arranging block 21. Also, see FIG. 13(B).

(3) Consequently, the central conductors 2D are disposed on the connection pads 3A and 3B via the anisotropic conductive film 11.

Figure 13B:
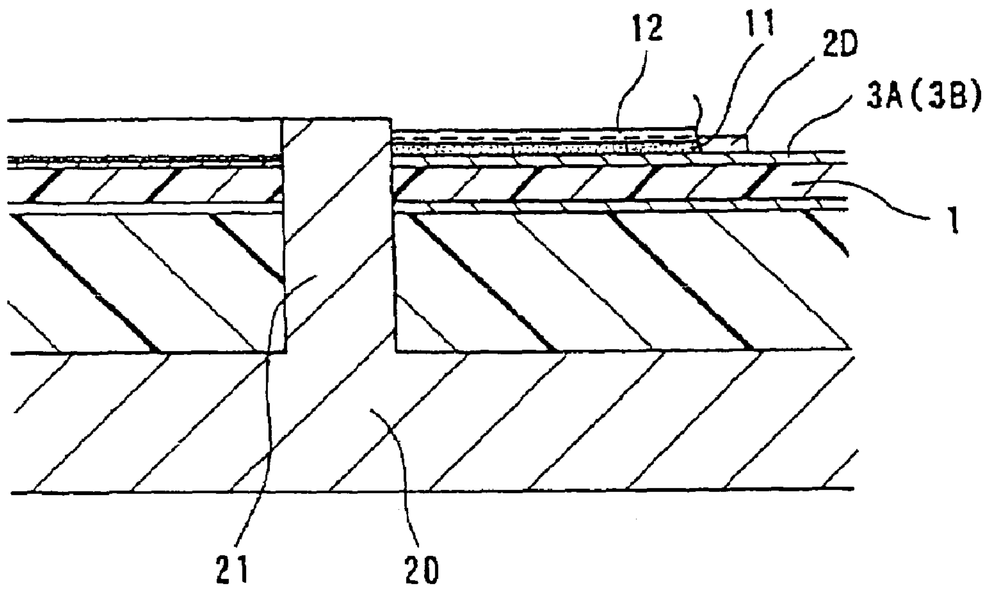

(4) The insulating film 12 is disposed to cover all of the central conductors 2D on the connection pads 3A and 3B. In FIG. 13(B), the edge portions of the conductive film 12 and the insulating film 11 are removed to show the central conductor 2D. Then, the insulating film 12 is pressed in a high temperature atmosphere. It is preferred that the pressure is done through an elastic member to ensure that the entire area is pressed even if the insulating film is deformed around the central conductors.

Figure 14:
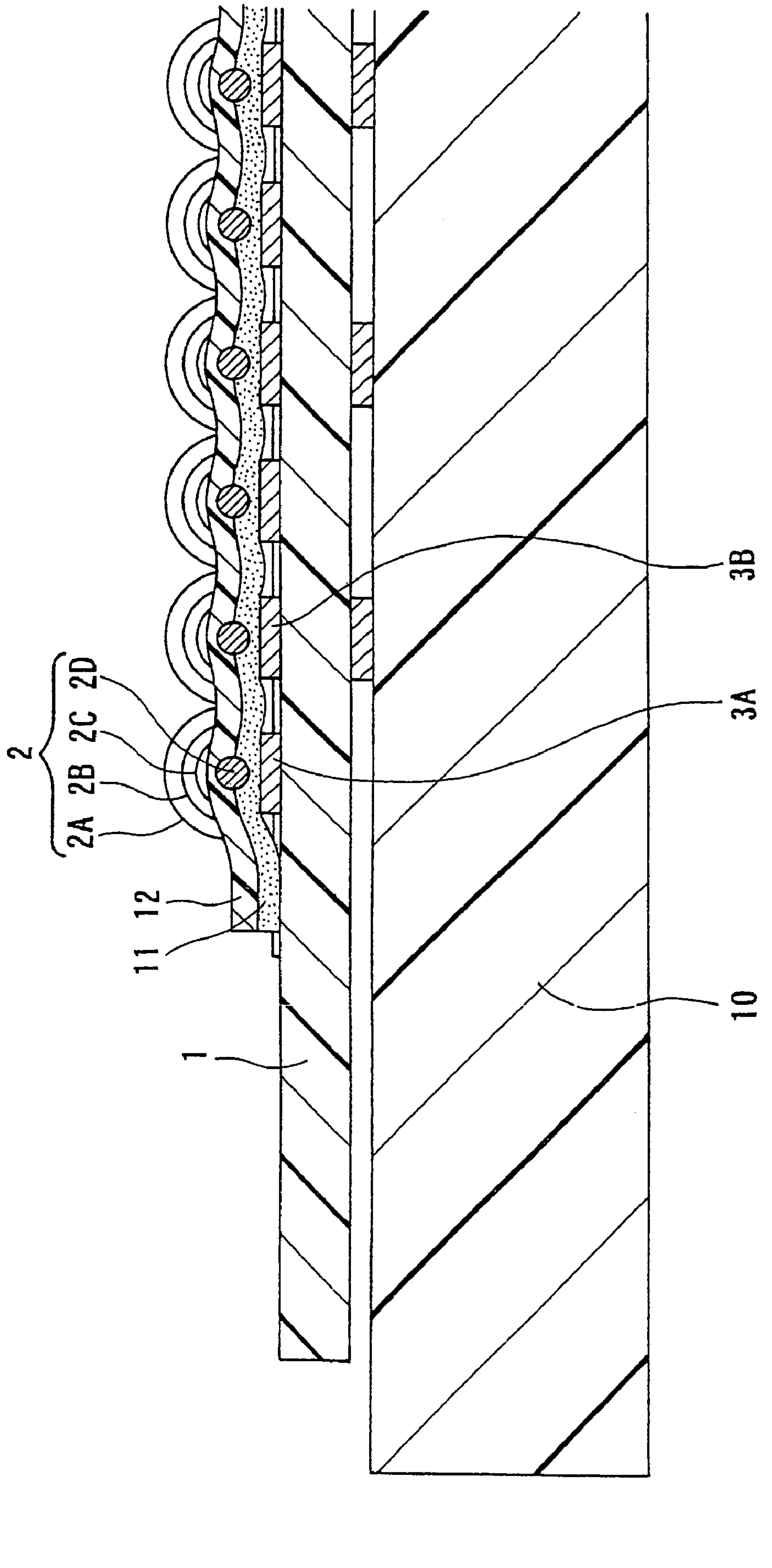
FIG. 14 is a sectional view taken along line 14—14 of FIG. 8.

As shown in FIG. 14, as a result of the pressure, the central conductors 2D are connected to the connection pads 3A and 3B via the conductive film 11. The shield 2B of each cable 2 is soldered to the ground pad 9.

(5) The connector equipped with the cables is removed from the jig 20.

(6) When the connector with the cables is plugged to a mating connector, the contact pads 5D and 4C are brought into spring contact with the contact sections of the mating connector for electrical connection.

The contact pads 5D and 4C on the bottom face may be provided separately on the top and bottom faces of a circuit board to slide on the terminals of a mating connector. In this case, the narrow paths 7A and 7B serve as guiding path.

Another embodiment will be described wherein cables are connected to terminals held by a housing instead of the circuit board described above.

Figure 15A:
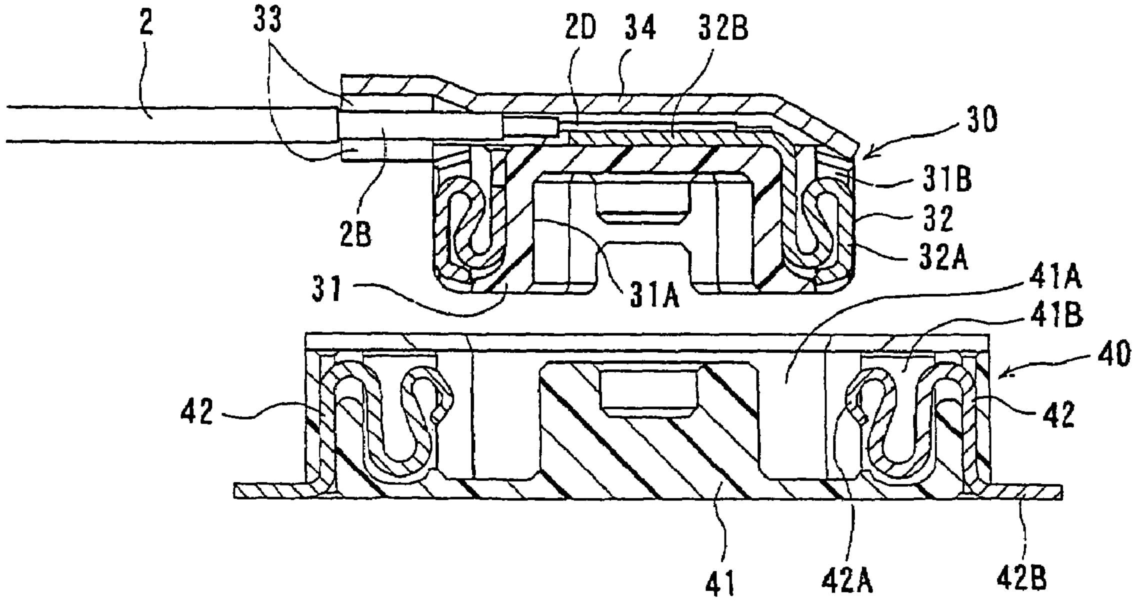
FIGS. 15(A) and (B) are sectional views taken along lines 15(A)—15(A) and 15(B)—15(B) of FIG. 16, respectively.
Figure 15B:
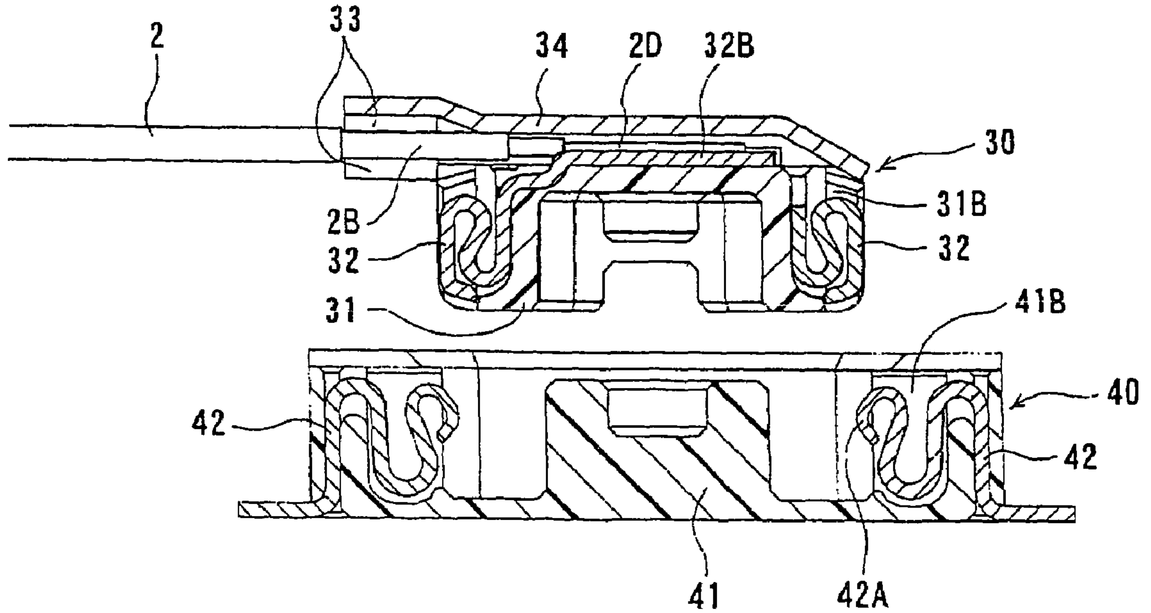

In FIG. 15, a connector 30 includes a housing 31 with a recess 31A and a plurality of terminals 32 held in the slits 31B provided in the housing 1. The terminal 32 has a contact section 32A at the free end of an S-shaped spring section and a connection section 32B extending along the top face of the housing 31. As shown in FIGS. 15(A) and (B), the left and right side terminals 32 are arranged alternately at every other intervals in the terminal arranging direction perpendicular to the sheet so that the connection sections 32B are arranged in alternate directions with the same pitch of the connection sections on the top face of the housing 31.

A mating connector 40 includes a housing 41 with a recess 41A for receiving the housing 31 of the connector 30 and a plurality of terminals 42 supported by the housing 41. The terminal 42 housed in a slit 41B of the housing 41 has a contact section 42A at the free end of an S-shaped spring section and a connection section 42B projecting from the housing 41 so as to be substantially flush with the bottom of the housing 41. The connectors 30 and 40 are well known and their detailed description will be omitted. The form of the connector or terminals is not critical as far as the connection sections of terminals are arranged on a plane.

Figure 16:
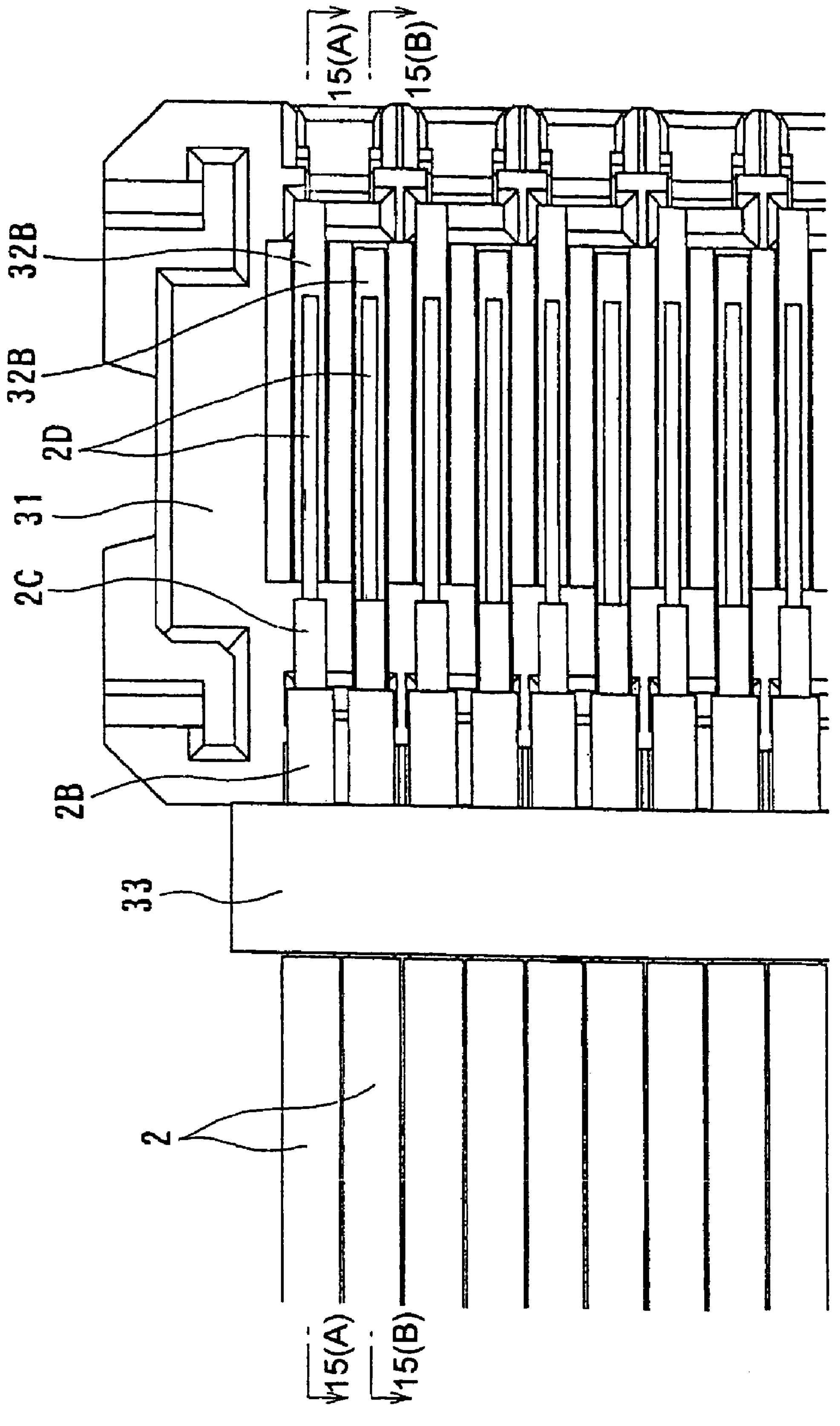
FIG. 16 is a plan view of a connector equipped with cables according to the ninth embodiment of the invention.

In FIG. 16, a plurality of cables 2 are connected to the connector 30. The connection sections 32B of left and right side terminals 32 are arranged alternately. For better understanding, reference is made to FIGS. 15(A) and (B) which are sectional views taken along line A—A and B—B of FIG. 16. The central conductors 2D of the respective cables 2 are put on the connection sections 32B in the respective grooves for connection by bonding with the conductive film in the same manner as in the above embodiment.

The shields 2B of the cables 2 is held between a common ground bar 33 for connection. Alternatively, they may be connected to the ground bar 33 with solder or conductive bond. As shown in FIGS. 15(A) and (B), a shield plate 34 is attached to the connector 30 equipped with the cables 2. In use, the connector 40 is provided on a circuit board (not shown) and the connection sections 42B of the terminals 42 are soldered to the corresponding circuit traces of the circuit board. The connector 30 is plugged into the connector 40 so that the cables 2 are electrically connected to the corresponding circuit traces of the circuit board.

The invention claimed is:

1. A cable connection structure, comprising:

an insulation holding body;

a connection section supported by said insulation holding body;

a core wire of a cable provided at a position corresponding to that of said connection section;

a bonding agent provided on at least said insulation holding body; and an insulation member provided on both said core wire and said bonding agent to press said bonding agent between said insulation member and said insulation holding body, thereby bonding said insulation member to said insulation holding body, wherein said connection section is a terminal and said insulation holding body is a housing.

2. The cable connection structure according to claim 1, wherein said connection section is project from said insulation holding body.

3. The cable connection structure according to claim 1, wherein said connection section is indented from said insulation holding body.

4. The cable connection structure according to claim 1, wherein said connection section has a concave surface for contact with said bonding agent.

5. The cable connection structure according to claim 1, wherein said insulation member is an insulation film.

6. The cable connection structure according to claim 1, wherein said core wire is flattened before connection.

7. The cable connection structure according to claim 1, wherein said bonding agent is made of an anisotropic conductive material.

8. A cable connection structure, comprising:

an insulation holding body;

a connection section supported by said insulation holding body;

a core wire of a cable provided at a position corresponding to that of said connection section;

a bonding agent provided on at least said insulation holding body; and an insulation member provided on both said core wire and said bonding agent to press said bonding agent between said insulation member and said insulation holding body, thereby bonding said insulation member to said insulation holding body, wherein said connection section is a land provided on a circuit board and said insulation holding body is a body of said circuit board.

9. The cable connection structure according to claim 8, wherein said connection section is project from said insulation holding body.

10. The cable connection structure according to claim 8, wherein said insulation member is an insulation film.

11. The cable connection structure according to claim 8, wherein said core wire is flattened before connection.

12. The cable connection structure according to claim 8, wherein said bonding agent is made of an anisotropic conductive material.

* * * * *